US012713885B2

(12) United States Patent
Takahata

(10) Patent No.: US 12,713,885 B2
(45) Date of Patent: Aug. 18, 2026

(54) SEMICONDUCTOR DEVICE MANUFACTURING METHOD

(71) Applicant: Kioxia Corporation, Tokyo (JP)

(72) Inventor: Kazuhiro Takahata, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 760 days.

(21) Appl. No.: 17/892,385

(22) Filed: Aug. 22, 2022

(65) Prior Publication Data

US 2023/0282510 A1 Sep. 7, 2023

(30) Foreign Application Priority Data

Mar. 7, 2022 (JP) ................................ 2022-034657

(51) Int. Cl.

*H10W 20/00* (2026.01)
*H10B 41/27* (2023.01)
*H10B 43/27* (2023.01)

(52) U.S. Cl.

CPC ..... *H10W 20/089* (2026.01); *H10W 20/0698* (2026.01); *H10W 20/083* (2026.01); *H10B 41/27* (2023.02); *H10B 43/27* (2023.02)

(58) Field of Classification Search

CPC ......... H01L 21/76816; H01L 21/76805; H01L 21/76895; H01L 21/0273–0279; H01L 21/312–3128; H10B 41/27; H10B 43/27; H10B 41/10; H10B 43/10; H10B 41/50; H10B 43/50; H10B 41/20; H10B 41/23; H10B 43/20; H10B 43/23; H10W 20/089; H10W 20/0698; H10W 20/083; H10W 20/0234; H10W 20/0238; H10W 20/0242; H10W 20/069; H10W 20/0693;

(Continued)

(56) References Cited

U.S. PATENT DOCUMENTS 8,633,099 B1 1/2014 Shih et al.
2012/0306089 A1* 12/2012 Freeman .......... H01L 21/76892 257/773

(Continued)

FOREIGN PATENT DOCUMENTS

JP 2014-022717 A 2/2014
JP 2015-056434 A 3/2015
JP 2021-027290 A 2/2021

*Primary Examiner* — Julio J Maldonado
*Assistant Examiner* — Paul A Berry
(74) *Attorney, Agent, or Firm* — Foley & Lardner LLP

(57) ABSTRACT

A semiconductor device manufacturing method includes forming, on a substrate, a stacked body including a plurality of first films and a plurality of second films alternately stacked in a height direction; and forming a number (m×n) of holes through the stacked body that haves a number (m×n) of depths. The number (m) depths are arranged in a first direction intersecting the height direction and the number (n) depths are arranged in a second direction intersecting the height direction and the first direction. Further, the step of forming a number (m×n) of holes includes forming, on the stacked body, a mask member having a number (m) of heights in the first direction; and forming, in the stacked body, a number (m×n) of holes having number (m) depths in the first direction and number (n) depths based on the mask member.

15 Claims, 18 Drawing Sheets

(58) Field of Classification Search
CPC ..... H10W 20/081; H10W 20/42; H10P 50/20; H10P 50/26; H10P 50/28; H10P 50/69; H10P 50/692; H10P 50/693; H10P 50/71; H10P 50/73; H10P 50/696
See application file for complete search history.

(56) References Cited

U.S. PATENT DOCUMENTS

| | | | | |
|---|---|---|---|---|
| 2013/0095654 | A1* | 4/2013 | Kwon | H01L 21/76831 438/666 |
| 2015/0069496 | A1 | 3/2015 | Shiga | |
| 2016/0118249 | A1* | 4/2016 | Sreenivasan | H01L 21/02521 977/890 |
| 2017/0263445 | A1* | 9/2017 | Soda | H01L 21/4846 |
| 2018/0286678 | A1* | 10/2018 | Lee | H01L 21/76831 |
| 2019/0074249 | A1* | 3/2019 | Sasaki | H10W 20/089 |
| 2020/0152502 | A1* | 5/2020 | Hsu | H10W 20/021 |
| 2021/0043640 | A1 | 2/2021 | Kawaguchi et al. | |

* cited by examiner

Z
X
Y
9
8
4
3
2
1
11
11
11
11
11
L
M
M
12
13
14
15
7
5
6

+5
H8 H6
H7
H1
H2
H3
H4
H5
25
H9 H10
Y
Z X

H6 H7 H8 H9 H10
21
20
50
6
Z
Y
X

H1
H2
H3
H4
H5
110
20
5
6
Z
Y
X

H1
H2
H3
H4
H5
20
5
6
Z
Y
X

H1
H2
H3
H4
H5
11
16
20
5
6
Z
Y
X 23
21
20
6
50
Z
Y
X

SEMICONDUCTOR DEVICE MANUFACTURING METHOD

CROSS-REFERENCE TO RELATED APPLICATION(S)

This application is based upon and claims the benefit of priority from Japanese Patent Application No. 2022-034657, filed Mar. 7, 2022, the entire contents of which are incorporated herein by reference.

FIELD

Embodiments described herein relate generally to a semiconductor device manufacturing method.

BACKGROUND

When manufacturing a three-dimensional semiconductor memory, it is typical to form contact holes with respectively different depths. When the number of contact holes increases, the forming process can become increasingly challenging, which can in turn result in increasing a total cost in manufacturing a three-dimensional semiconductor memory.

DESCRIPTION OF THE DRAWINGS

FIG. 9 is a perspective view wherein FIG. 8 is partially transparent.

DETAILED DESCRIPTION

Embodiments provide a semiconductor device manufacturing method such that holes having a multiple of depths can be formed efficiently.

In general, according to one embodiment, a semiconductor device manufacturing method includes forming, on a substrate, a stacked body including a plurality of first films and a plurality of second films alternately stacked in a height direction; and forming a number (m×n) of holes through the stacked body that haves a number (m×n) of depths. The number (m) depths are arranged in a first direction intersecting the height direction and the number (n) depths are arranged in a second direction intersecting the height direction and the first direction. Further, the step of forming a number (m×n) of holes includes forming, on the stacked body, a mask member having a number (m) of heights in the first direction; and forming, in the stacked body, a number (m×n) of holes having m depths in the first direction and n depths based on the mask member.

Hereafter, embodiments of the present disclosure will be described, with reference to the drawings. In FIGS. 1 to 29, identical reference signs are allotted to identical or similar configurations, and a redundant description will be omitted.

First Embodiment

Figure 1:
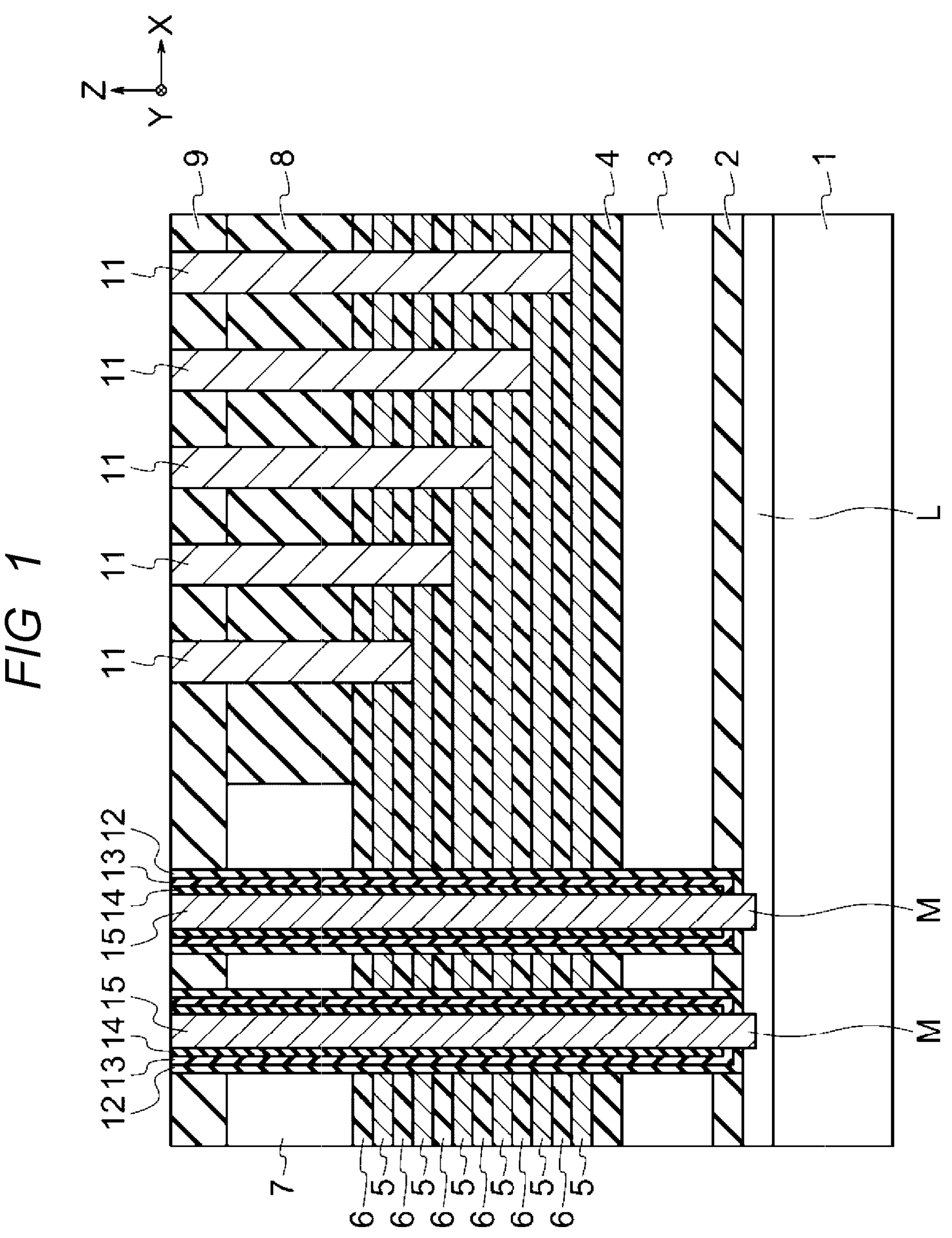
FIG. 1 is a sectional view showing a structure of a semiconductor device according to a first embodiment.

FIG. 1 is a sectional view showing a structure of a semiconductor device according to a first embodiment. The semiconductor device of FIG. 1 includes a three-dimensional semiconductor memory.

The semiconductor device of FIG. 1 includes a substrate 1, a first insulating film 2, a source side conductive layer 3, a second insulating film 4, a multiple of electrode layers 5, a multiple of insulating layers 6 that are examples of a second film, a drain side conductive layer 7, a first interlayer insulating film 8, a second interlayer insulating film 9, a multiple of contact plugs 11, a first memory insulating film 12, a charge storage layer 13, a second memory insulating film 14, and a channel semiconductor layer 15.

The substrate 1 is a semiconductor substrate such as a silicon substrate. FIG. 1 shows an X direction and a Y direction, which are parallel to an upper face of the substrate 1 and perpendicular to each other, and a Z direction that is perpendicular to the upper face of the substrate 1. In the specification, a +Z direction is taken to be an upward direction, that is, a height direction, and a −Z direction is taken to be a downward direction. The −Z direction may correspond to a direction of gravitational force, or may be a direction that does not correspond to the direction of gravitational force.

The first insulating film 2 is formed on a diffusion layer L formed in the substrate 1. The source side conductive layer 3 is formed on the first insulating film 2, and the second insulating film 4 is formed on the source side conductive layer 3.

The multiple of electrode layers 5 and the multiple of insulating layers 6 are stacked alternately on the second insulating film 4. The electrode layers 5 are, for example, metal layers, and function as word lines or selection lines. The insulating layers 6 are, for example, silicon dioxide films.

The drain side conductive layer 7 and the first interlayer insulating film 8 are formed on the stacked body including the electrode layers 5 and the insulating layers 6. The second interlayer insulating film 9 is formed on the drain side conductive layer 7 and the first interlayer insulating film 8.

The multiple of contact plugs 11 are formed inside contact holes that penetrate one portion of the electrode layers 5 and the insulating layers 6, the first interlayer insulating film 8, and the second interlayer insulating film 9. Each of the contact plugs 11 is electrically connected to a different electrode layer 5. Each contact plug 11 is formed of, for example, a barrier metal layer such as a titanium-containing layer and a plug member layer such as a tungsten layer.

In the present embodiment, an insulating layer 16 (refer to FIG. 29) is formed between a side face of the contact plug 11 and a side face of the electrode layer 5 in order to prevent the side face of the contact plug 11 and the side face of the electrode layer 5 from coming into contact. Meanwhile, a lower face of each contact plug 11 comes into contact with an upper face of the corresponding electrode layer 5.

The first memory insulating film 12, the charge storage layer 13, and the second memory insulating film 14 are formed in order on a side face of a memory hole M that penetrates the first insulating film 2, the source side conductive layer 3, the second insulating film 4, the electrode layers 5, the insulating layers 6, the drain side conductive layer 7, and the second interlayer insulating film 9. The channel semiconductor layer 15 is formed inside the memory hole M across the first memory insulating film 12, the charge storage layer 13, and the second memory insulating film 14, and is electrically connected to the substrate 1.

The first memory insulating film 12 is, for example, a silicon dioxide film. The charge storage layer 13 is, for example, a silicon nitride film. The second memory insulating film 14 is, for example, a silicon dioxide film. The channel semiconductor layer 15 is, for example, a polysilicon layer. The charge storage layer 13 may also be a semiconductor layer such as a polysilicon layer.

These are formed by, for example, the first memory insulating film 12, the charge storage layer 13, and the second memory insulating film 14 being formed in order on the side face and a bottom face of the memory hole M, the second memory insulating film 14, the charge storage layer 13, and the first memory insulating film 12 being removed from the bottom face of the memory hole M, and the channel semiconductor layer 15 subsequently being embedded inside the memory hole M. A core member including an insulating material may be further embedded in a center of the channel semiconductor layer 15.

Next, a semiconductor device manufacturing method according to the first embodiment will be described.

Figure 2:
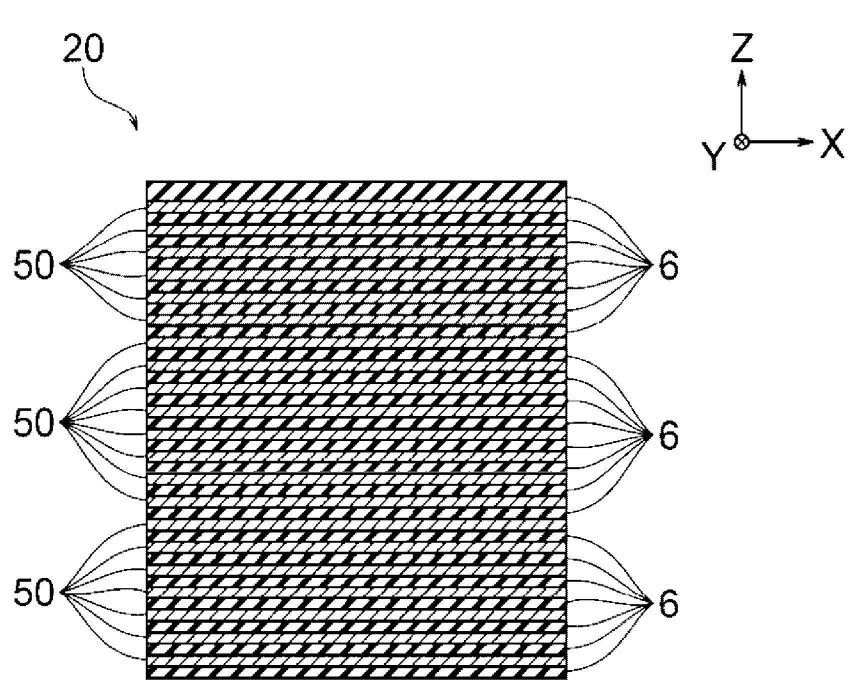
FIG. 2 is a sectional view showing a semiconductor device manufacturing method according to the first embodiment.

FIG. 2 is a sectional view showing the semiconductor device manufacturing method according to the first embodiment. Firstly, as shown in FIG. 2, a stacked body 20 including a sacrificial layer 50, which is an example of a first film, and the insulating layer 6 alternately and repeatedly stacked in the height direction (the +Z direction) perpendicular to the upper face of the substrate 1 is formed on the substrate 1. The sacrificial layer 50 is, for example, a silicon nitride film (SiN). The insulating layer 6 is, for example, a silicon dioxide film ($SiO_2$). Furthermore, the first interlayer insulating film 8 and the second interlayer insulating film 9 are formed on the stacked body 20. A depiction of the substrate 1 is omitted from FIG. 2. Also, the first interlayer insulating film 8 and the second interlayer insulating film 9 are represented combined with the uppermost insulating layer 6 in FIG. 2 (the same applies in subsequent drawings).

Figure 3:
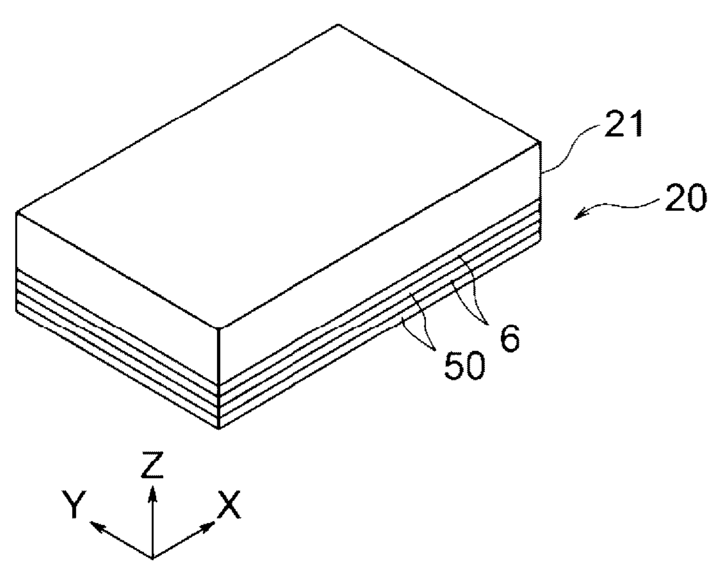
FIG. 3 is a perspective view showing the semiconductor device manufacturing method according to the first embodiment subsequent to FIG. 2.

FIG. 3 is a perspective view showing the semiconductor device manufacturing method according to the first embodiment subsequent to FIG. 2. After the stacked body 20 is formed, a hard mask layer 21 is formed on the stacked body 20, as shown in FIG. 3. The hard mask layer 21 is, for example, an amorphous silicon layer, or a metal layer of tungsten or the like.

Figure 4:
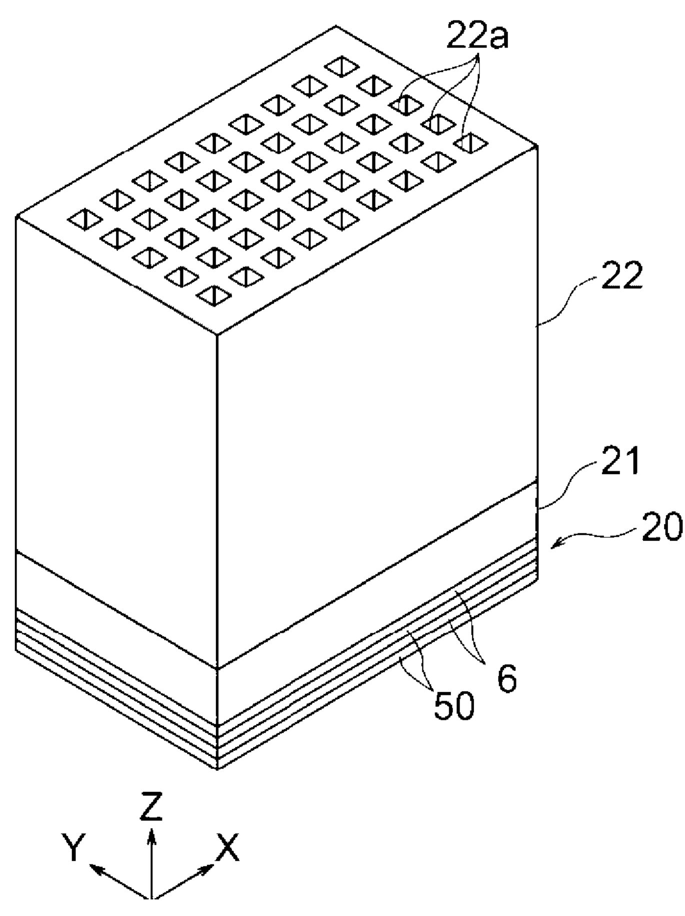
FIG. 4 is a perspective view showing the semiconductor device manufacturing method according to the first embodiment subsequent to FIG. 3.

FIG. 4 is a perspective view showing the semiconductor device manufacturing method according to the first embodiment subsequent to FIG. 3. After the hard mask layer 21 is formed, a resist film 22 is formed on the hard mask layer 21, as shown in FIG. 4. After the resist film 22 is formed, a multiple of hole patterns 22*a* are formed in the resist film 22 using a photolithographic method. In the example shown in FIG. 4, a cross-section of the hole pattern 22*a* is of a square form. A cross-section of the hole pattern 22*a* may also be circular. The multiple of hole patterns 22*a* are formed in such a way as to penetrate the resist film 22 in the height direction (the +Z direction). Also, as shown in FIG. 4, the multiple of hole patterns 22*a* are formed in such a way as to be neighboring in the X direction and the Y direction perpendicular to the height direction. Positions in the Y direction of hole patterns 22*a* neighboring in the X direction are the same. Positions in the X direction of hole patterns 22*a* neighboring in the Y direction are the same. That is, a quantity m×n of the hole patterns 22*a* are formed disposed in a lattice form of a quantity m in the Y direction and a quantity n in the X direction. In FIG. 4, m is 5 and n is 9.

Figure 5:
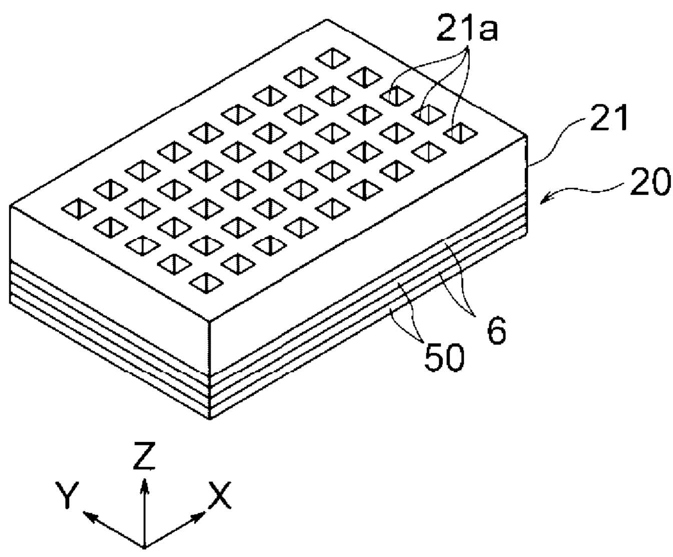
FIG. 5 is a perspective view showing the semiconductor device manufacturing method according to the first embodiment subsequent to FIG. 4.

FIG. 5 is a perspective view showing the semiconductor device manufacturing method according to the first embodiment subsequent to FIG. 4. After the hole patterns 22*a* are formed in the resist film 22, a multiple of hole patterns 21*a* that penetrate the hard mask layer 21 are formed in the hard mask layer 21 by etching with the resist film 22 as a mask, as shown in FIG. 5. A depiction of the resist film 22 is omitted from FIG. 5. The hole patterns 21*a* of the hard mask layer 21 are formed in approximately the same positions in the X direction and the Y direction as the corresponding hole patterns 22*a* of the resist film 22. That is, as shown in FIG. 5, a quantity m×n of the hole patterns 21*a* are formed disposed in a lattice form of a quantity m in the Y direction and a quantity n in the X direction. In FIG. 5, m is 5 and n is 9.

Figure 6:
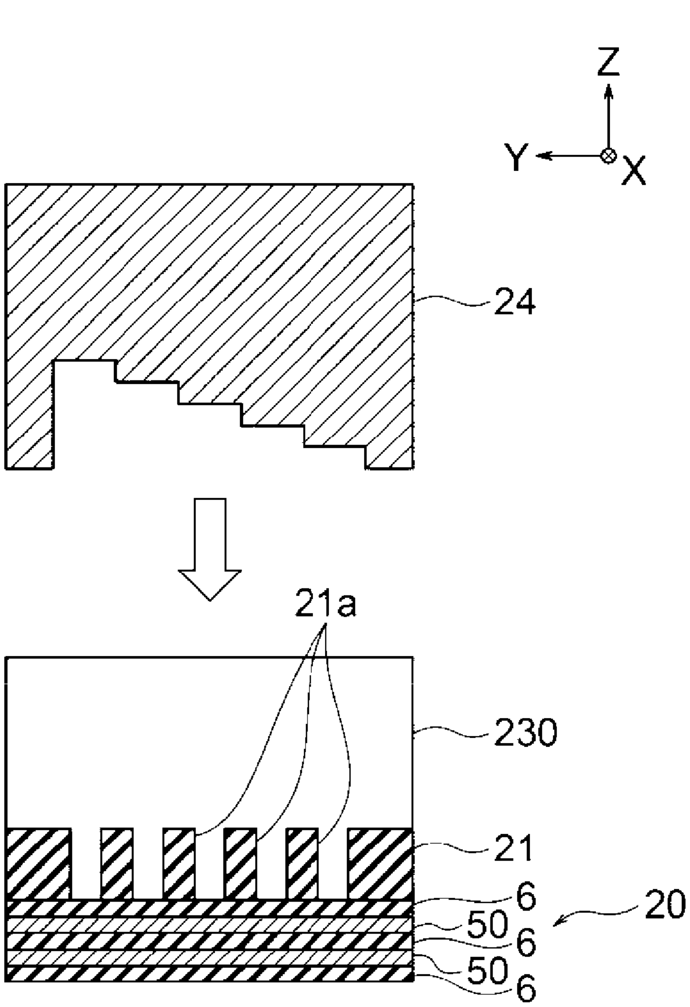
FIG. 6 is a perspective view showing the semiconductor device manufacturing method according to the first embodiment subsequent to FIG. 5.
Figure 7:
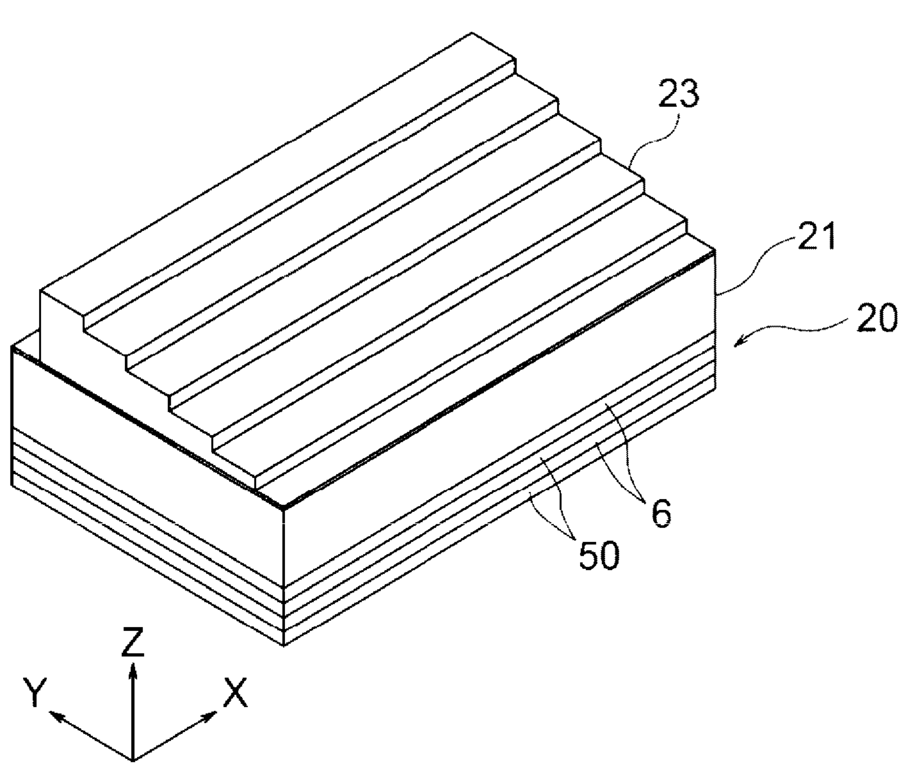
FIG. 7 is a perspective view showing the semiconductor device manufacturing method according to the first embodiment subsequent to FIG. 6.

FIG. 6 is a perspective view showing the semiconductor device manufacturing method according to the first embodiment subsequent to FIG. 5. FIG. 7 is a perspective view showing the semiconductor device manufacturing method according to the first embodiment subsequent to FIG. 6. Next, in order to form a quantity m×n of contact holes having m kinds of depth in the stacked body 20, a stepped-form resist film 23 having m kinds of height that differ in the Y direction is formed on the stacked body 20, as shown in FIG. 7. "Height" can also be called "thickness". In FIG. 7, m is 5. The kinds of height of the resist film 23 are the kinds of height of the resist film 23 positioned above the hole patterns 21*a* of the hard mask layer 21, that is, the kinds of height of the resist film 23 affecting a timing of processing the stacked body 20. Consequently, a height of the resist film 23 differing from the heights of the resist film 23 positioned above the hole patterns 21*a* is excluded from the kinds of height. The resist film 23 is formed in such a way that heights in the X direction (that is, heights above the hole patterns 21*a*, or in other words, heights in positions corresponding to contact holes) are uniform. The resist film 23 is formed in such a way as to fill the hole patterns 21*a*. The resist film 23 is formed of a material whose resistance to reactive ion etching (RIE) is lower than that of the hard mask layer 21. The resist film 23 is formed using a nanoimprint lithographic method. A nanoimprint lithographic method is such that, firstly, a resist 230 is disposed on the hard mask layer 21, as shown in FIG. 6. Disposition of the resist 230 is carried out by a dripping of the resist 230 using, for example, an inkjet nozzle. The resist 230 may be, for example, an ultraviolet-curable resin. After the resist 230 is disposed, the resist 230 is pressed using a template 24 on which a pattern is provided, thereby transferring the pattern of the template 24 to the resist 230. The pattern of the template 24 is a pattern that is an inversion of a desired form of the resist film 23. In FIG. 6, the pattern of the template 24 is a recessed pattern having m kinds of depth differing in the Y direction. In FIG. 6, m is 5. By curing the resist 230 in a state wherein the template 24 is pressed against the resist 230, and removing the template 24 from the cured resist 230, the resist film 23 in which the pattern of the template 24 is formed is obtained. The resist 230 may be cured using, for example, ultraviolet radiation.

Figure 8:
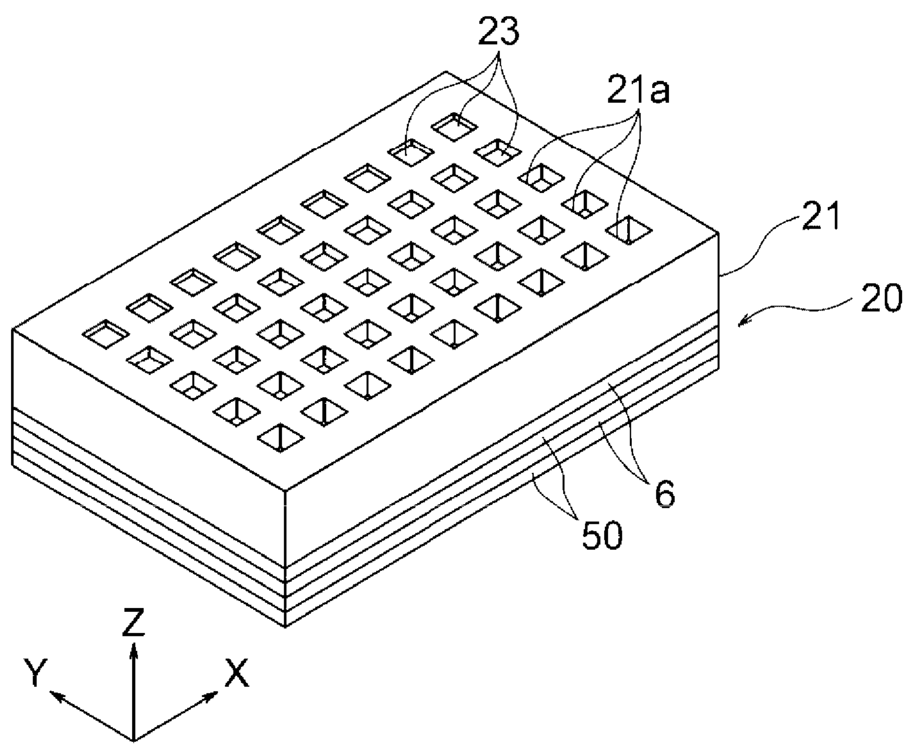
FIG. 8 is a perspective view showing the semiconductor device manufacturing method according to the first embodiment subsequent to FIG. 7.
Figure 9:
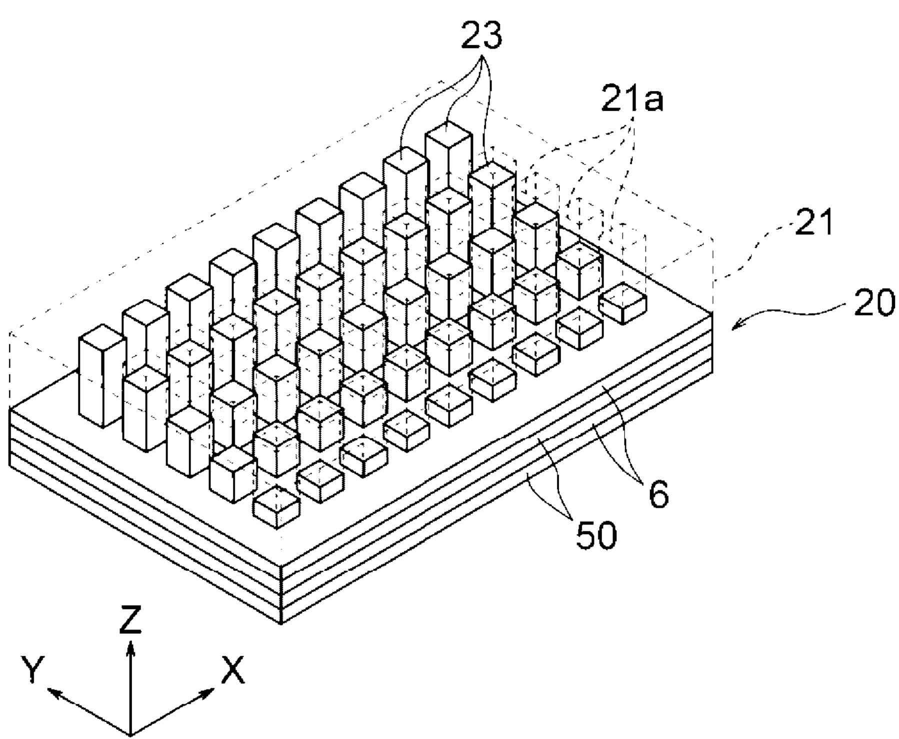

FIG. 8 is a perspective view showing the semiconductor device manufacturing method according to the first embodiment subsequent to FIG. 7. FIG. 9 is a perspective view wherein FIG. 8 is partially transparent. After the resist film 23 having the m kinds of height is formed, reactive ion etching with the hard mask layer 21 as a mask is carried out, as shown in FIGS. 8 and 9. Owing to the resist film 23 having the m kinds of height as originally formed, the resist film 23 maintains the state of having the m kinds of height while height decreases overall, even while reactive ion etching is being carried out, as shown in FIGS. 8 and 9. Owing to the resist film 23 maintaining the m kinds of height, timings of shifting from a processing of the resist film 23 to a processing of the stacked body 20 can be staggered among the hole patterns 21*a*, in whose interiors the heights of the resist film 23 differ. Owing to the timings of shifting to a processing of the stacked body 20 being staggered, contact holes H1 to H5 having m kinds of depth, to be described hereafter, can be formed in the stacked body 20. Reactive ion etching processing conditions (for example, a kind of gas to be used and a processing temperature) may be conditions more appropriate to an etching rate of the resist film 23 than to an etching rate of the stacked body 20 until a lowest portion of the resist film 23 in the interiors of the hole patterns 21*a* is removed from the stacked body 20. After the lowest portion of the resist film 23 in the interiors of the hole patterns 21*a* is removed from the stacked body 20, the reactive ion etching processing conditions may be conditions more appropriate to the etching rate of the stacked body 20 than to the etching rate of the resist film 23.

Figure 10:
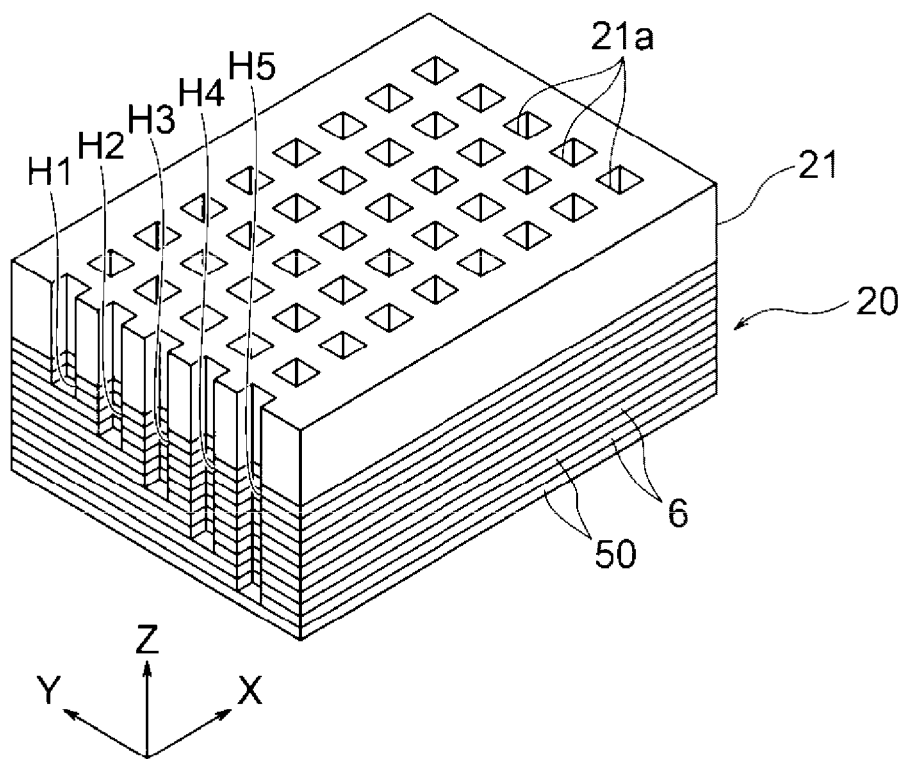
FIG. 10 is a perspective view showing the semiconductor device manufacturing method according to the first embodiment subsequent to FIG. 8.
Figure 11:
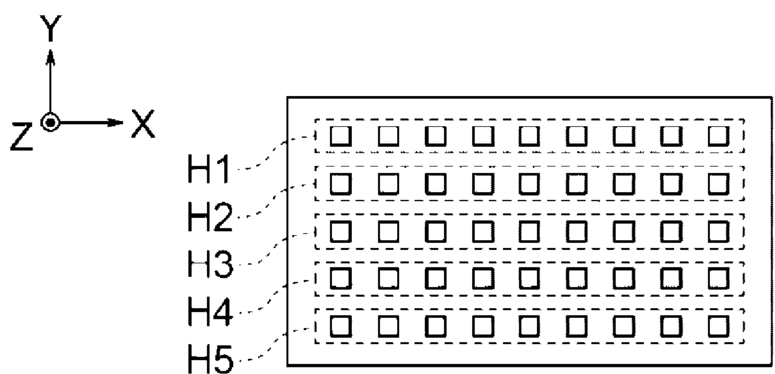
FIG. 11 is a plan view showing the semiconductor device manufacturing method according to the first embodiment subsequent to FIG. 8.

FIG. 10 is a perspective view showing the semiconductor device manufacturing method according to the first embodiment subsequent to FIG. 8. FIG. 11 is a plan view showing the semiconductor device manufacturing method according to the first embodiment subsequent to FIG. 8. After the resist film 23 is removed, the stacked body 20 is processed using reactive ion etching with the hard mask layer 21 as a mask, whereby a quantity m×n of the contact holes H1 to H5 having m kinds of depth differing in the Y direction are formed, as shown in FIGS. 10 and 11. In FIGS. 10 and 11, m is 5 and n is 9. More specifically, a quantity n of the contact holes H1 neighboring each other in the X direction are formed to a depth penetrating one set of the sacrificial layer 50 and the insulating layer 6, as shown in FIG. 10. A quantity n of the contact holes H2 neighboring the contact holes H1 in the Y direction and neighboring each other in the X direction are formed to a depth penetrating two sets of the sacrificial layer 50 and the insulating layer 6. A quantity n of the contact holes H3 neighboring the contact holes H2 in the Y direction and neighboring each other in the X direction are formed to a depth penetrating three sets of the sacrificial layer 50 and the insulating layer 6. A quantity n of the contact holes H4 neighboring the contact holes H3 in the Y direction and neighboring each other in the X direction are formed to a depth penetrating four sets of the sacrificial layer 50 and the insulating layer 6. A quantity n of the contact holes H5 neighboring the contact holes H4 in the Y direction and neighboring each other in the X direction are formed to a depth penetrating five sets of the sacrificial layer 50 and the insulating layer 6.

Owing to the quantity m×n of the contact holes H1 to H5 having the m kinds of depth being formed in the stacked body 20 as heretofore described, a subsequent number of times contact holes are processed using a resist film 25 (refer to FIG. 12) can be reduced.

Figure 12:
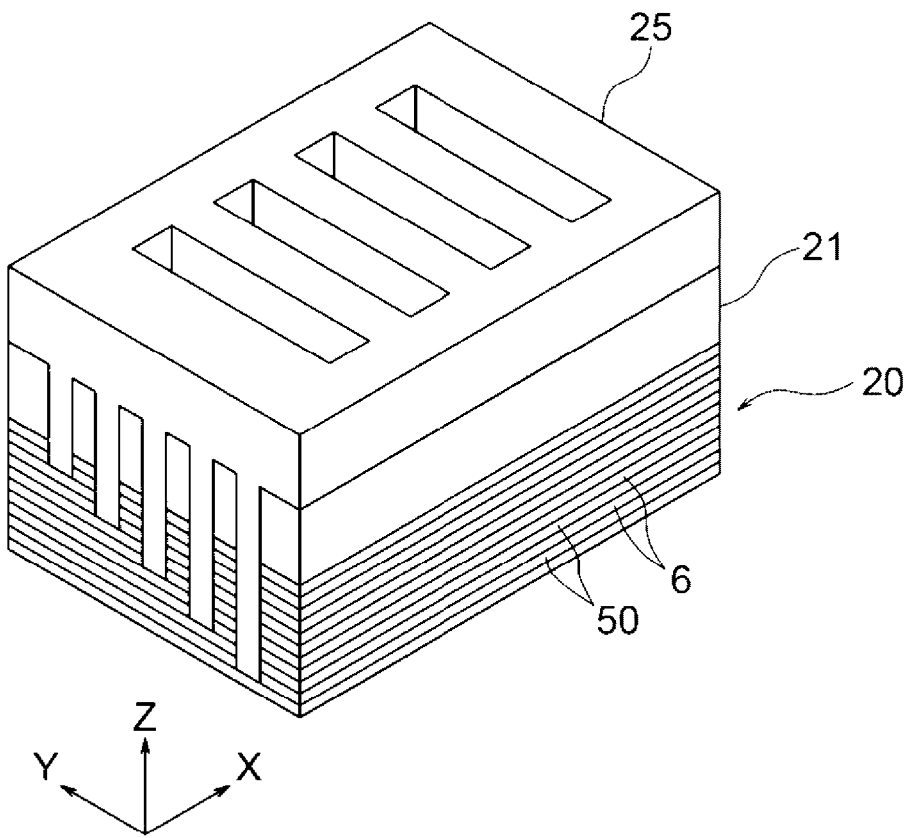
FIG. 12 is a perspective view showing the semiconductor device manufacturing method according to the first embodiment subsequent to FIG. 10.

FIG. 12 is a perspective view showing the semiconductor device manufacturing method according to the first embodiment subsequent to FIG. 10. After the quantity m×n of the contact holes H1 to H5 having the m kinds of depth are formed, the quantity m×n of the contact holes H1 to H5 are processed in such a way as to have m×n kinds of depth. In the processing of the contact holes H1 to H5, the resist film 25, which causes one portion of the contact holes H1 to H5 among the quantity m×n of the contact holes H1 to H5 to be exposed, is formed on the hard mask layer 21, as shown in FIG. 12. The resist film 25 may be formed using, for example, a photolithographic method. After the resist film 25 is formed, the contact holes H1 to H5 exposed in the resist film 25 are processed using reactive ion etching with the resist film 25 and the hard mask layer 21 as a mask. Formation of the resist film 25 and processing of the contact holes H1 to H5 exposed in the resist film 25 are repeated while changing the contact holes H1 to H5 caused to be exposed in the resist film 25. Because of this, a quantity m×n of contact holes having m×n kinds of depth are obtained.

Specifically, when a quantity m of contact holes neighboring in the Y direction is defined as being one row of contact holes, formation of the resist film 25 is carried out in such a way as to cause contact holes to be exposed in units of $2^{(k-1)}$ rows in the X direction from the contact holes in a $2^{(k-1)}+1$ row (k≥1) in the X direction, leaving $2^{(k-1)}$ rows of contact holes between, to a limit not exceeding a total number of rows n of contact holes. "A limit not exceeding a total number of rows n" means that a number of rows of contact holes exposed in the resist film 25 and a number of times exposure is repeated are restricted by the total number of rows n of contact holes. Processing of contact holes exposed in the resist film 25 is carried out k times in a range of $n \geq 2^{(k-1)}+1$.

Figures 13, 14:
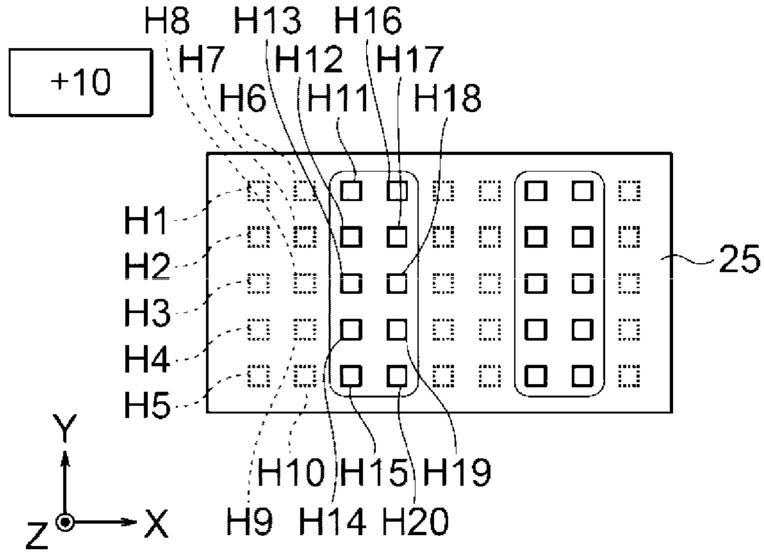
FIG. 13 is a plan view showing the semiconductor device manufacturing method according to the first embodiment subsequent to FIG. 12.
FIG. 14 is a plan view showing the semiconductor device manufacturing method according to the first embodiment subsequent to FIG. 13.

FIG. 13 is a plan view showing the semiconductor device manufacturing method according to the first embodiment subsequent to FIG. 12. More specifically, firstly, a first (k=1) formation of the resist film 25 is carried out, as shown in FIG. 13. The first formation of the resist film 25 is carried out in such a way as to cause the contact holes H1 to H5 to be exposed in units of one row in the X direction from the contact holes H1 to H5 in a second row in the X direction, leaving one row of the contact holes H1 to H5 between. Further, a first contact hole processing is carried out with the contact holes H1 to H5 exposed in the resist film 25 as a target. In FIG. 13, the first contact hole processing is carried out to an amount penetrating five sets of the sacrificial layer 50 and the insulating layer 6 ("+5" in FIG. 13). Herein, "+i" representing a contact hole processing amount means that i sets' worth of sets of the sacrificial layer 50 and the insulating layer 6 are processed in a depth direction (the −Z direction) from a bottom portion of the contact holes (the same applies hereafter). For example, "+5" in FIG. 13 means that five sets' worth of sets of the sacrificial layer 50 and the insulating layer 6 are processed in the depth direction from the bottom portion of the contact holes. Contact hole processing is carried out to a processing amount corresponding to a maximum depth of the contact holes immediately before processing. Because of this, as shown in FIG. 13, a contact hole H6 having a depth penetrating six sets of the sacrificial layer 50 and the insulating layer 6, a contact hole H7 having a depth penetrating seven sets of the sacrificial layer 50 and the insulating layer 6, a contact hole H8 having a depth penetrating eight sets of the sacrificial layer 50 and the insulating layer 6, a contact hole H9 having a depth penetrating nine sets of the sacrificial layer 50 and the insulating layer 6, and a contact hole H10 having a depth penetrating ten sets of the sacrificial layer 50 and the insulating layer 6, are formed. Consequently, ten kinds of contact hole depth are formed by the first resist film 25 formation and contact hole processing.

FIG. 14 is a plan view showing the semiconductor device manufacturing method according to the first embodiment subsequent to FIG. 13. Next, a second (k=2) formation of the resist film 25 is carried out, as shown in FIG. 14. The second formation of the resist film 25 is carried out in such a way as to cause the contact holes H1 to H10 to be exposed in units of two rows in the X direction from the contact holes H1 to H5 in a third row in the X direction, leaving two rows of the contact holes H1 to H10 between. Further, a second contact hole processing is carried out with the contact holes H1 to H10 exposed in the resist film 25 as a target. In FIG. 14, the second contact hole processing is carried out to an amount penetrating ten sets of the sacrificial layer 50 and the insulating layer 6 ("+10" in FIG. 14). Because of this, as shown in FIG. 14, contact holes H11 to H20 having ten new kinds of depth from the contact hole H11, which has a depth penetrating 11 sets of the sacrificial layer 50 and the insulating layer 6, to the contact hole H20, which has a depth penetrating 20 sets of the sacrificial layer 50 and the insulating layer 6, are formed. Consequently, there are 20 kinds of contact hole depth owing to the second resist film 25 formation and contact hole processing.

Figure 15:
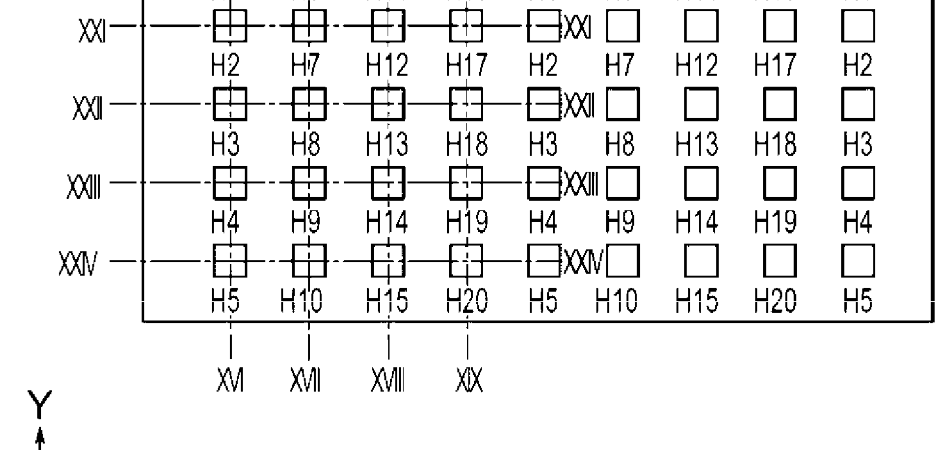
FIG. 15 is a plan view showing the semiconductor device manufacturing method according to the first embodiment subsequent to FIG. 14.
Figure 16:
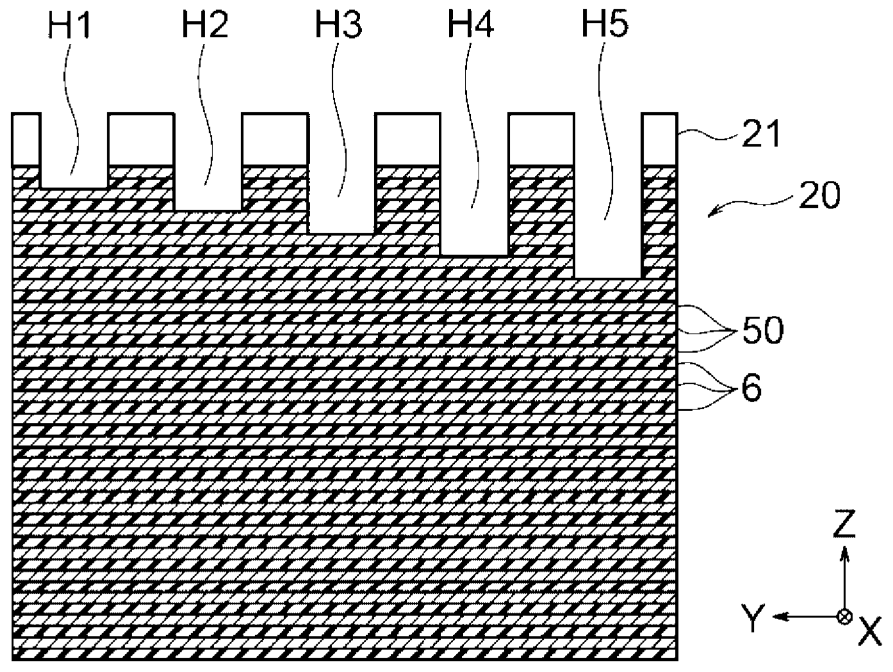
FIG. 16 is a XVI-XVI sectional view of FIG. 15.
Figures 17, 18:
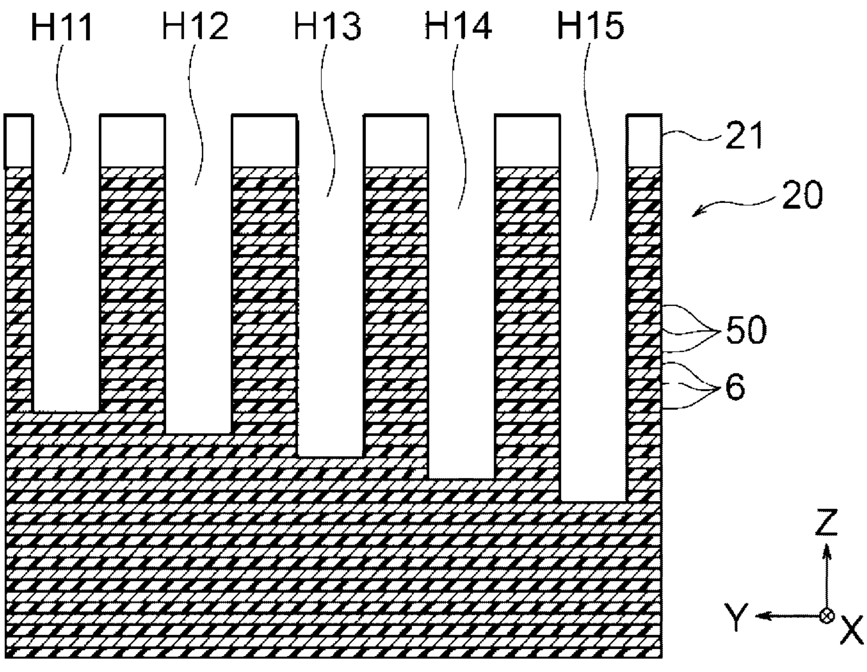
FIG. 17 is a XVII-XVII sectional view of FIG. 15.
FIG. 18 is a XVIII-XVIII sectional view of FIG. 15.
Figure 19:
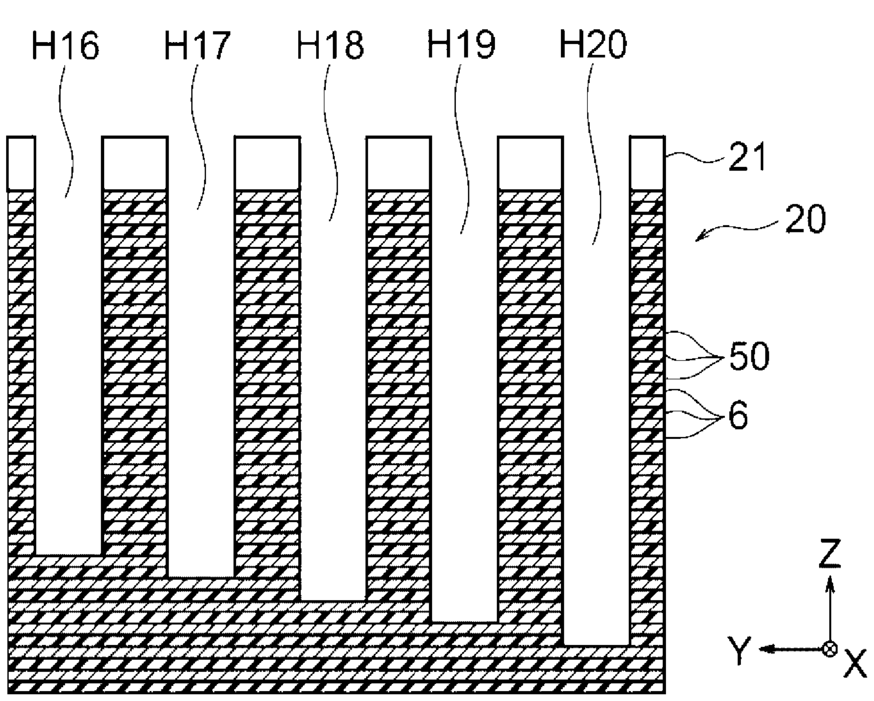
FIG. 19 is a XIX-XIX sectional view of FIG. 15.
Figure 20:
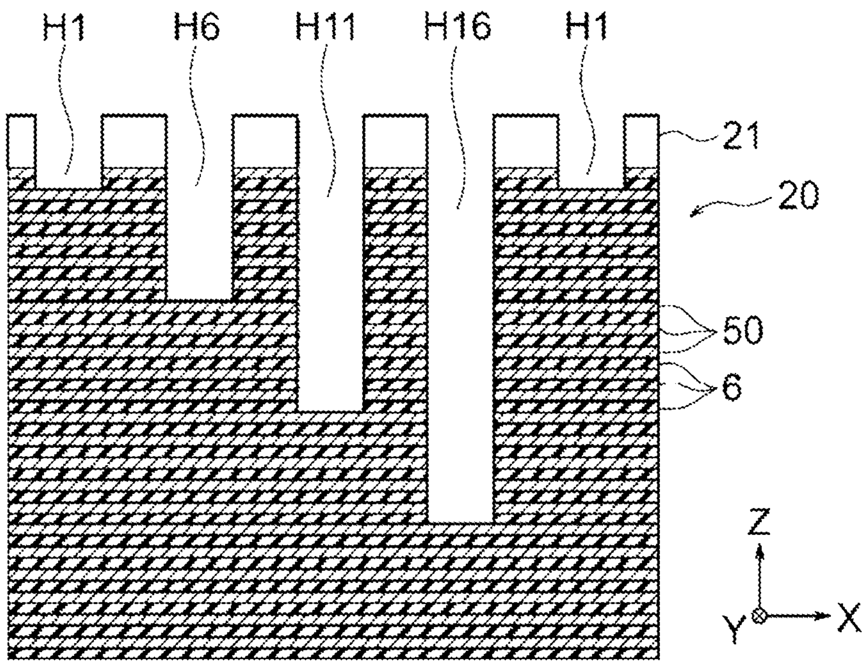
FIG. 20 is a XX-XX sectional view of FIG. 15.
Figure 21:
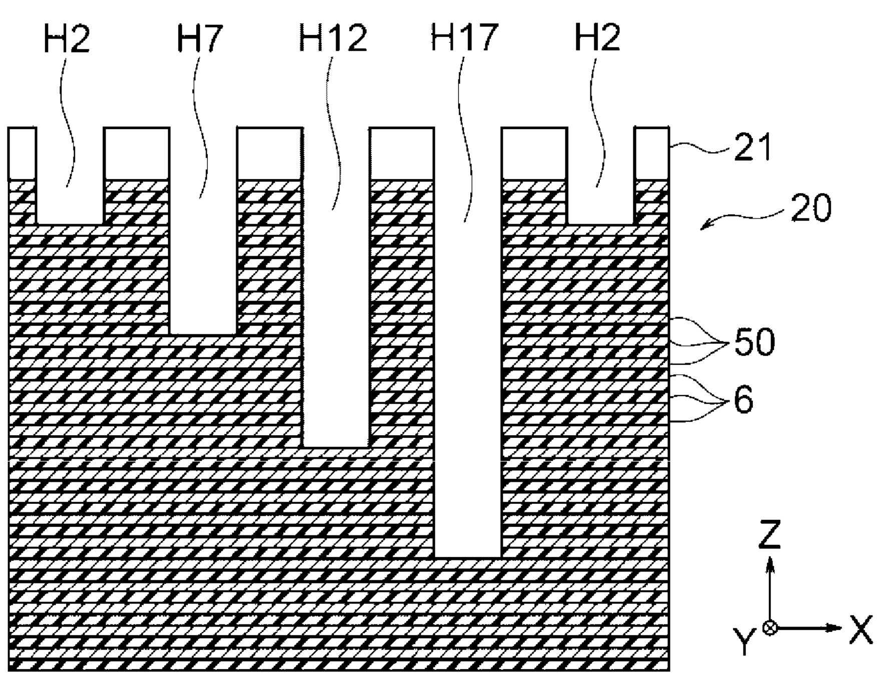
FIG. 21 is a XXI-XXI sectional view of FIG. 15.
Figure 22:
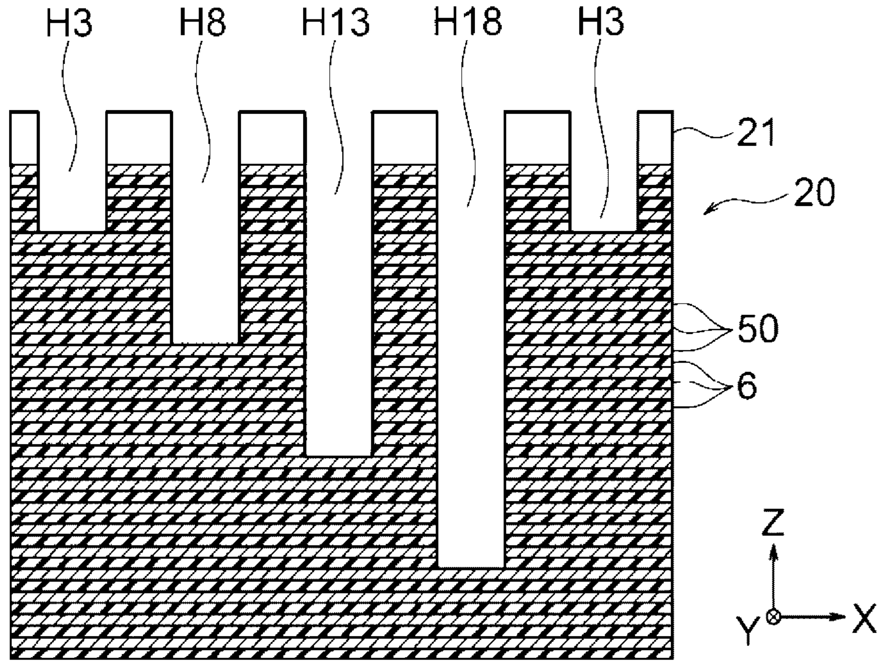
FIG. 22 is a XXII-XXII sectional view of FIG. 15.
Figure 23:
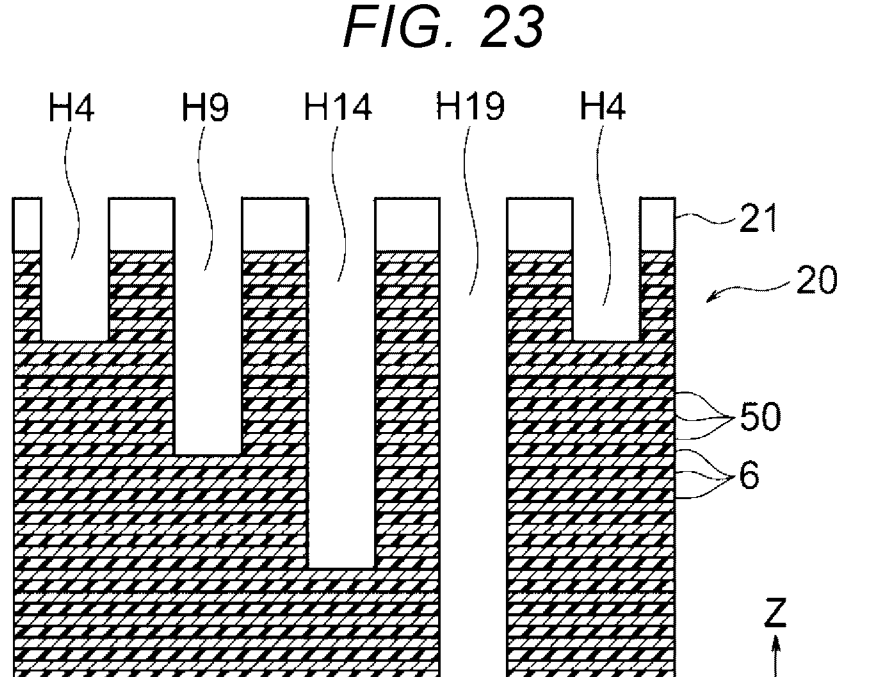
FIG. 23 is a XXIII-XXIII sectional view of FIG. 15.
Figure 24:
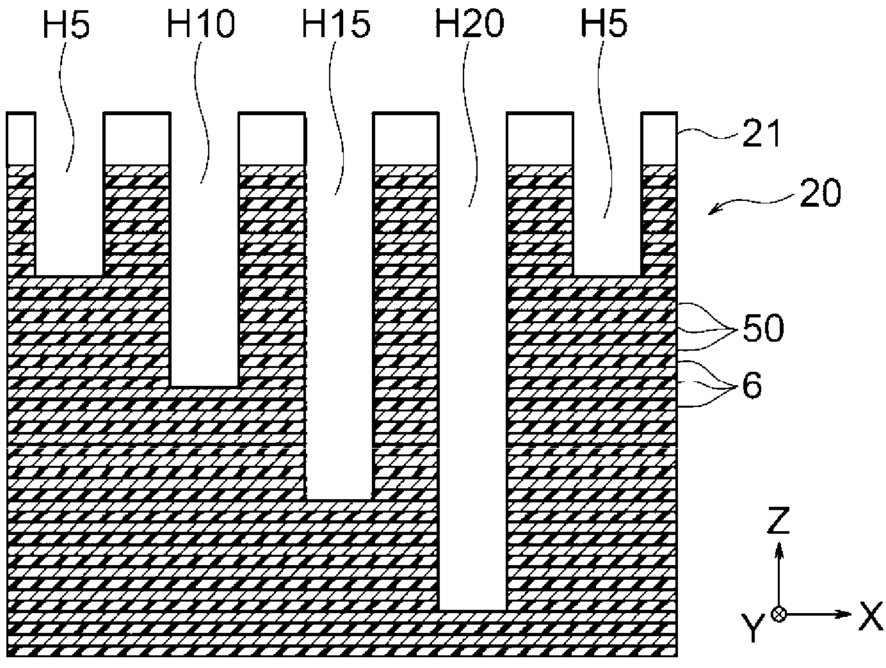
FIG. 24 is a XXIV-XXIV sectional view of FIG. 15.

FIG. 16 is a XVI-XVI sectional view of FIG. 15. FIG. 17 is a XVII-XVII sectional view of FIG. 15. FIG. 18 is a XVIII-XVIII sectional view of FIG. 15. FIG. 19 is a XIX-XIX sectional view of FIG. 15. FIG. 20 is a XX-XX sectional view of FIG. 15. FIG. 21 is a XXI-XXI sectional view of FIG. 15. FIG. 22 is a XXII-XXII sectional view of FIG. 15. FIG. 23 is a XXIII-XXIII sectional view of FIG. 15. FIG. 24 is a XXIV-XXIV sectional view of FIG. 15. Contact hole depths at a point at which the second contact hole processing finishes are as shown in FIGS. 16 to 24.

Figure 25:
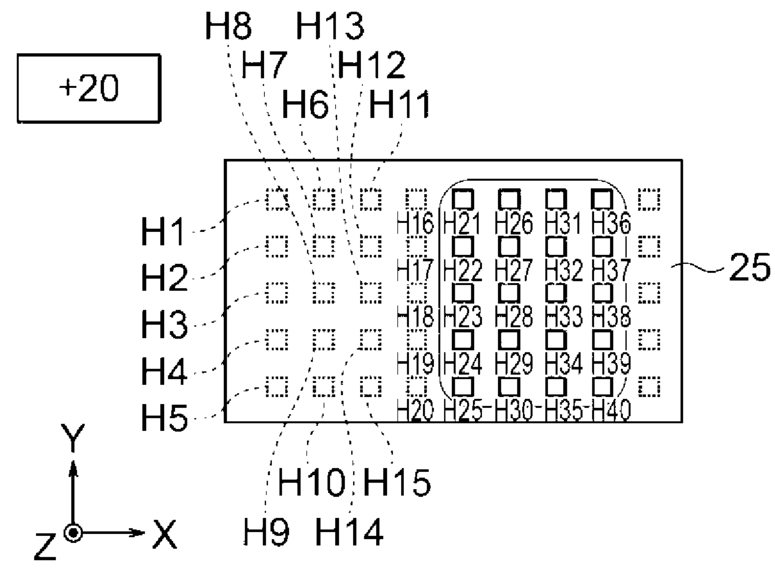
FIG. 25 is a plan view showing the semiconductor device manufacturing method according to the first embodiment subsequent to FIG. 15.

FIG. 25 is a plan view showing the semiconductor device manufacturing method according to the first embodiment subsequent to FIG. 15. Next, a third (k=3) formation of the resist film 25 is carried out, as shown in FIG. 15. The third formation of the resist film 25 is carried out in such a way as to cause the contact holes H1 to H20 to be exposed in units of four rows in the X direction from the contact holes H1 to H5 in a fifth row in the X direction. As the total number of contact hole rows is nine in FIG. 15, the resist film 25 cannot be formed in such a way as to cause four-row units of the contact holes H1 to H20 to be exposed leaving four rows of the contact holes H1 to H20 between. This means that in FIG. 15, the resist film 25 is formed in such a way that only one four-row unit of the contact holes H1 to H20 is caused to be exposed. Further, a third contact hole processing is carried out with the contact holes H1 to H20 exposed in the resist film 25 as a target. In FIG. 25, the third contact hole processing is carried out to an amount penetrating twenty sets of the sacrificial layer 50 and the insulating layer 6 ("+20" in FIG. 25). Because of this, as shown in FIG. 25, contact holes H21 to H40 having twenty new kinds of depth from the contact hole H21, which has a depth penetrating 21 sets of the sacrificial layer 50 and the insulating layer 6, to the contact hole H40, which has a depth penetrating 40 sets of the sacrificial layer 50 and the insulating layer 6, are formed. Consequently, there are 40 kinds of contact hole depth owing to the third resist film 25 formation and contact hole processing.

Lastly, a fourth formation of the resist film 25 is carried out. The fourth formation of the resist film 25 is carried out in such a way as to cause a ninth row in the X direction of the contact holes H1 to H5 to be exposed. Provisionally, when the number of contact hole rows is greater than nine, the fourth formation of the resist film 25 is carried out in such a way as to cause the contact holes H1 to H40 to be exposed in units of eight rows in the X direction from the contact holes H1 to H5 in the ninth row in the X direction, leaving eight rows of the contact holes H1 to H40 between. In the example shown, however, the total number of contact hole rows is nine, because of which the resist film 25 is formed in such a way as to cause only the ninth row of the contact holes H1 to H5 to be exposed. Further, a fourth contact hole processing is carried out with the contact holes H1 to H5 exposed in the resist film 25 as a target. The fourth contact hole processing is carried out to an amount penetrating 40 sets of the sacrificial layer 50 and the insulating layer 6. Because of this, contact holes H41 to H45 having five new kinds of depth from the contact hole H41, which has a depth penetrating 41 sets of the sacrificial layer 50 and the insulating layer 6, to the contact hole H45, which has a depth penetrating 45 sets of the sacrificial layer 50 and the insulating layer 6, are formed. Consequently, there are 45 kinds of contact hole depth owing to the fourth resist film 25 formation and contact hole processing. Because of this, a quantity m×n (5×9) of contact holes having m×n (5×9) kinds of depth are obtained.

Figure 26:
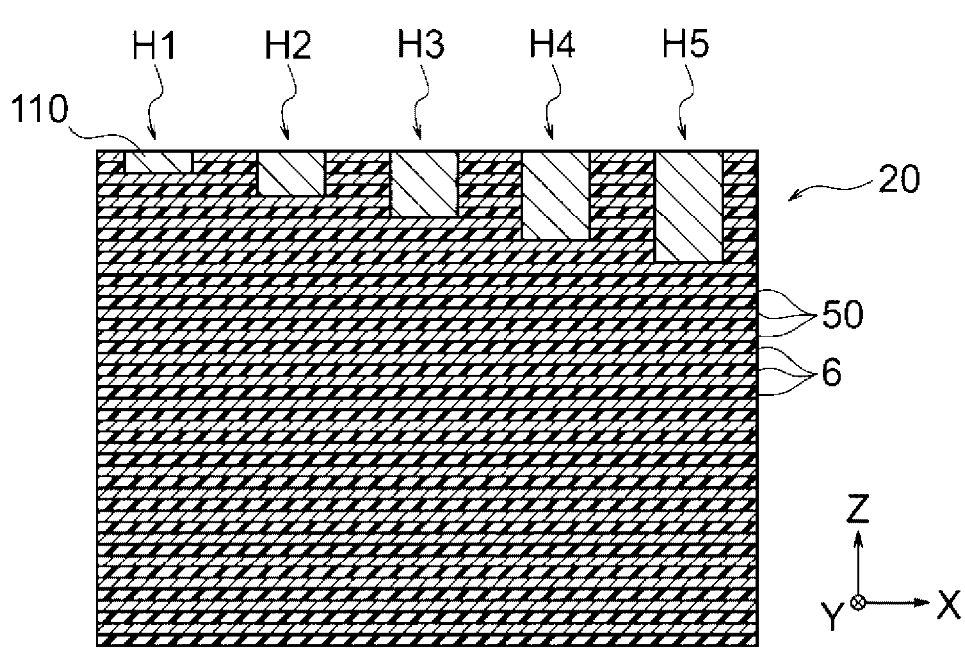
FIG. 26 is a sectional view showing the semiconductor device manufacturing method according to the first embodiment subsequent to FIG. 25.
Figures 27, 28:
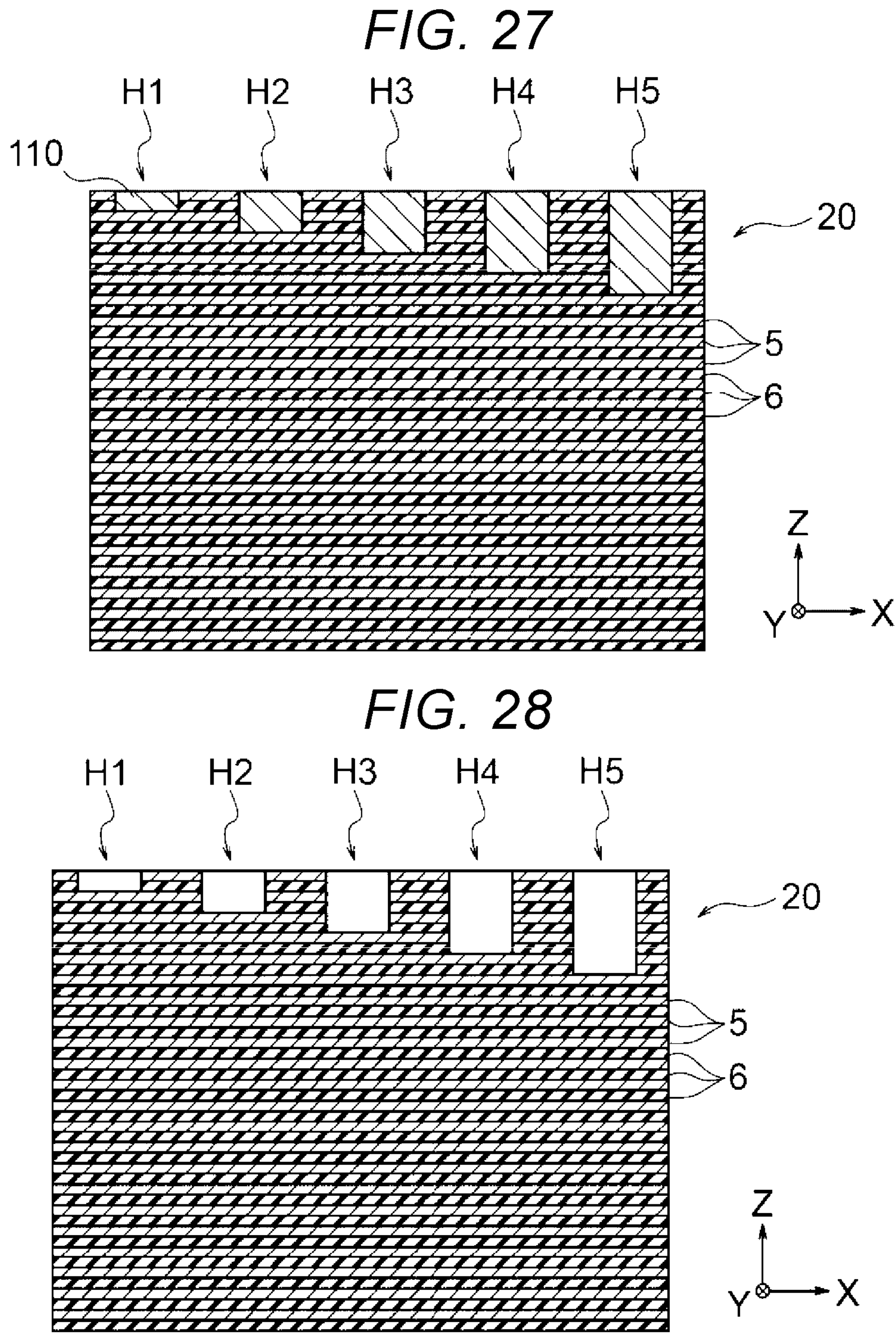
FIG. 27 is a sectional view showing the semiconductor device manufacturing method according to the first embodiment subsequent to FIG. 26.
FIG. 28 is a sectional view showing the semiconductor device manufacturing method according to the first embodiment subsequent to FIG. 27.
Figures 29, 30:
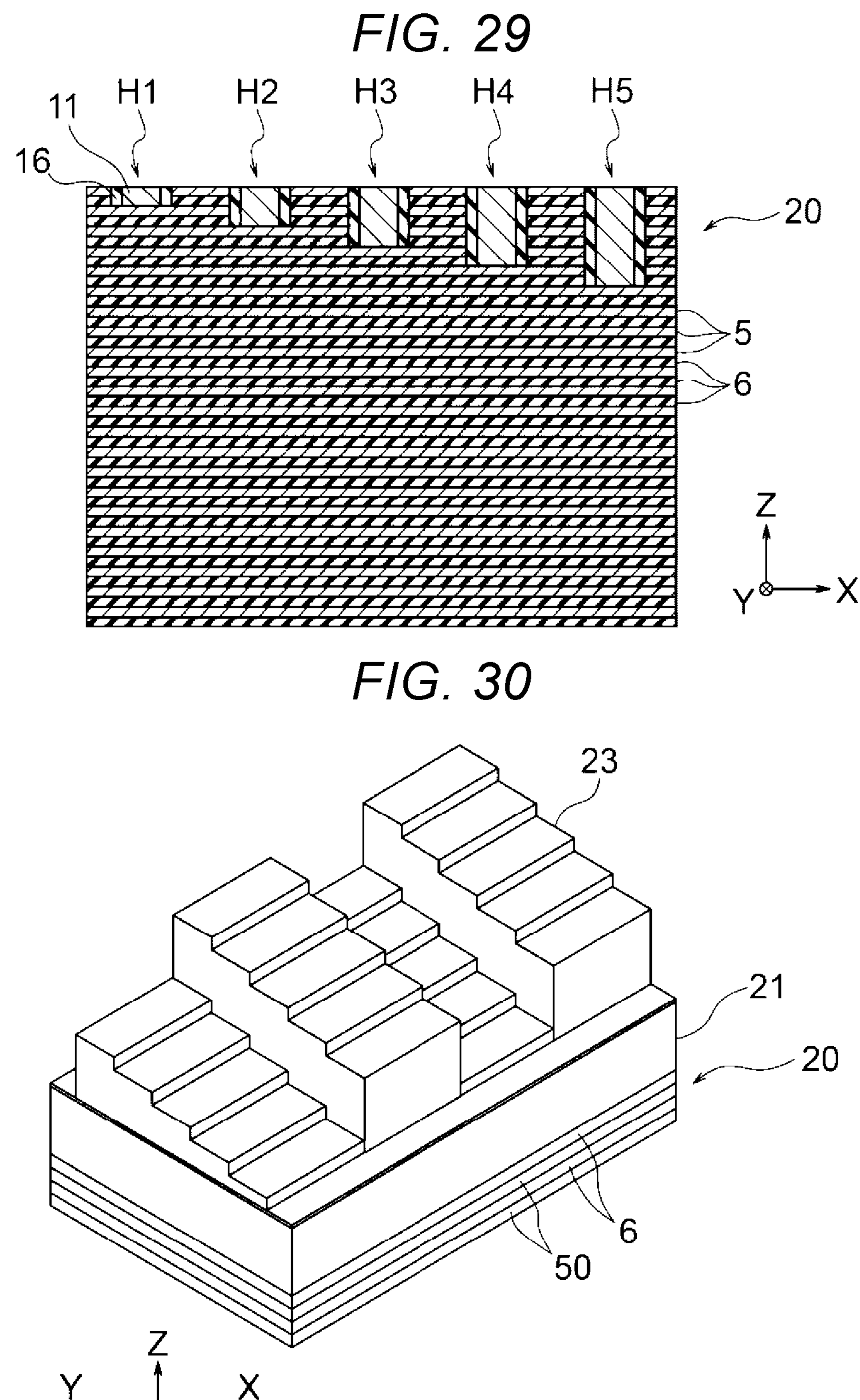
FIG. 29 is a sectional view showing the semiconductor device manufacturing method according to the first embodiment subsequent to FIG. 28.
FIG. 30 is a perspective view showing a semiconductor device manufacturing method according to a second embodiment.

After the m×n kinds of contact hole having the m×n kinds of depth are formed, a sacrificial layer 110 is formed in interiors of the contact holes in such a way as to fill the contact holes, as shown in FIG. 26. In FIG. 26, only the contact holes H1 to H5 of the first row are shown as representatives. The sacrificial layer 110 is, for example, a silicon dioxide film or an amorphous silicon film. After the sacrificial layer 110 is formed, an unshown slit that penetrates the stacked body 20 is formed. After the slit is formed, the sacrificial layers 50 are removed by a wet etching whereby the sacrificial layers 50 of the stacked body 20 are processed using a chemical introduced from the slit. After the sacrificial layers 50 are removed, the electrode layer 5 is deposited in cavities between the insulating layers 6 formed by removing the sacrificial layers 50. By so doing, the sacrificial layers 50 are replaced by the electrode layers 5, as shown in FIG. 27. After the sacrificial layers 50 are replaced by the electrode layers 5, the sacrificial layer 110 formed in the interiors of the contact holes is removed, as shown in FIG. 28. After the sacrificial layer 110 is removed, the insulating layer 16 is formed on the side walls of the contact holes, as shown in FIG. 29. After the insulating layer 16 is formed, the contact plug 11 is formed by a plug member layer being embedded on an inner side of the insulating layer 16.

Formation of the contact plug 11 is not limited to the heretofore described method. For example, a method may be such that after the m×n kinds of contact hole having the m×n kinds of depth are formed, the insulating layer 16 is formed on the side walls of the contact holes, as shown in FIG. 29, and a plug member layer is embedded on the inner side of the insulating layer 16, after which the kind of replacement shown in FIG. 27 is carried out.

When a quantity m×n of contact holes having m kinds of depth are not formed before processing in the stacked body 20, the number of times contact holes are processed using the resist film 25 increases. For example, when m=5, the number of times contact holes are processed using the resist film 25 doubles, even when the contact holes caused to be exposed in the resist film 25 are adjusted.

In response to this, according to the first embodiment, a quantity m×n of contact holes having m kinds of depth can be formed efficiently before processing in the stacked body 20 by staggering the timings of starting processing of the stacked body 20 using the resist film 23 that has m kinds of height. Owing to a quantity m×n of contact holes being formed before processing, the number of times contact holes are processed using the resist film 25 can be reduced. Consequently, according to the first embodiment, contact holes having a multiple of depths, and contact plugs inside the contact holes, can be formed efficiently.

Second Embodiment

Figure 31:
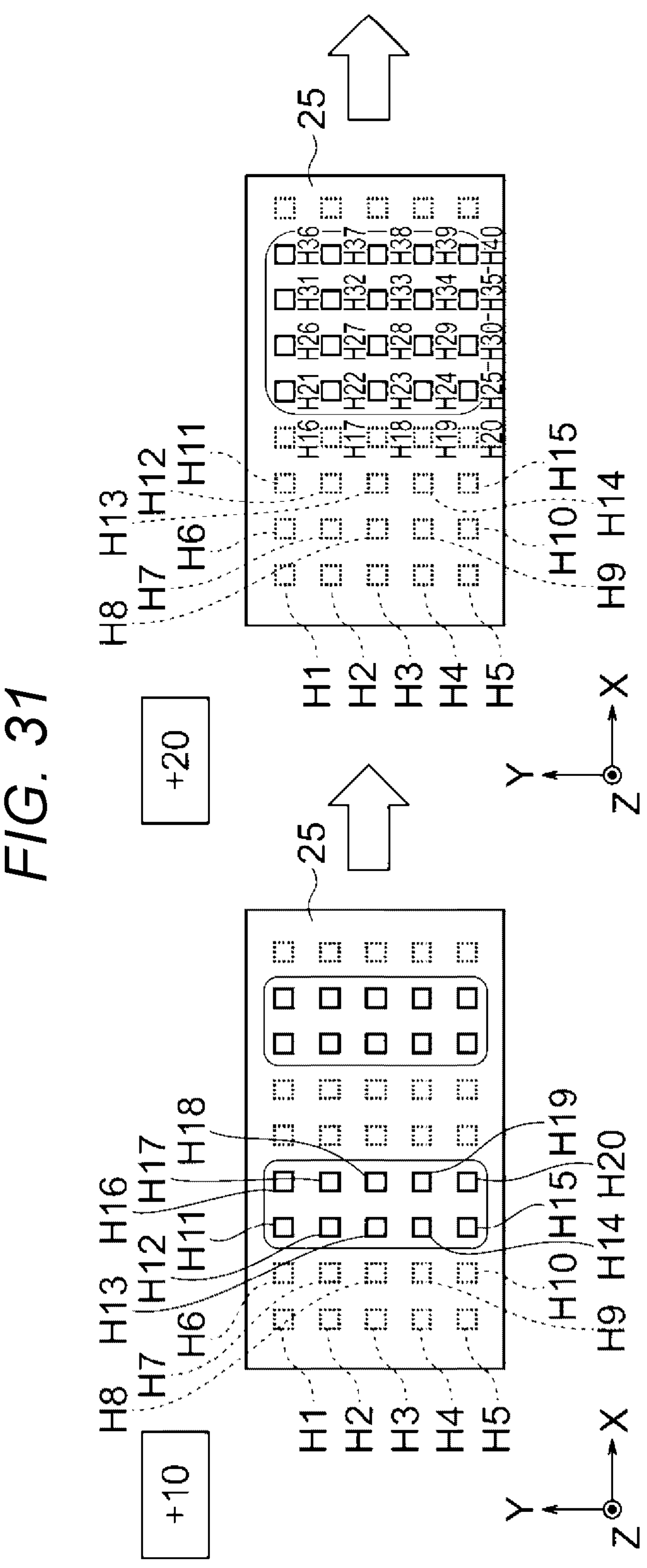
FIG. 31 is a plan view showing the semiconductor device manufacturing method according to the second embodiment subsequent to FIG. 30.

FIG. 30 is a perspective view showing a semiconductor device manufacturing method according to a second embodiment. FIG. 31 is a plan view showing the semiconductor device manufacturing method according to the second embodiment subsequent to FIG. 30.

In the first embodiment, an example wherein the contact holes H1 to H5 having m kinds of differing depths are formed in the stacked body 20, using the resist film 23 that has m kinds of height differing in the Y direction and uniform in the X direction, is described. As opposed to this, the second embodiment is such that contact holes having m×2 or more kinds of differing depths are formed in the stacked body 20 using the resist film 23 that has m×2 or more kinds of height differing in both the X direction and the Y direction. In FIG. 30, contact holes having m×2 kinds of depth are formed in the stacked body 20 using the resist film 23 that has m×2 kinds (m kinds in the Y direction and 2 kinds in the X direction) of height. In FIG. 30, m is 5.

According to the second embodiment, the kinds of depth of contact holes formed before processing in the stacked body 20 can be increased in comparison with the case of the first embodiment. Because of this, the number of times contact holes are processed using the resist film 25 can be reduced. For example, processing of contact holes using the resist film 25 can be started from a processing amount that penetrates 10 sets of the sacrificial layer 50 and the insulating layer 6, as shown in FIG. 31. Consequently, contact holes having a multiple of depths, and contact plugs inside the contact holes, can be formed still more efficiently.

Third Embodiment

Figure 32:
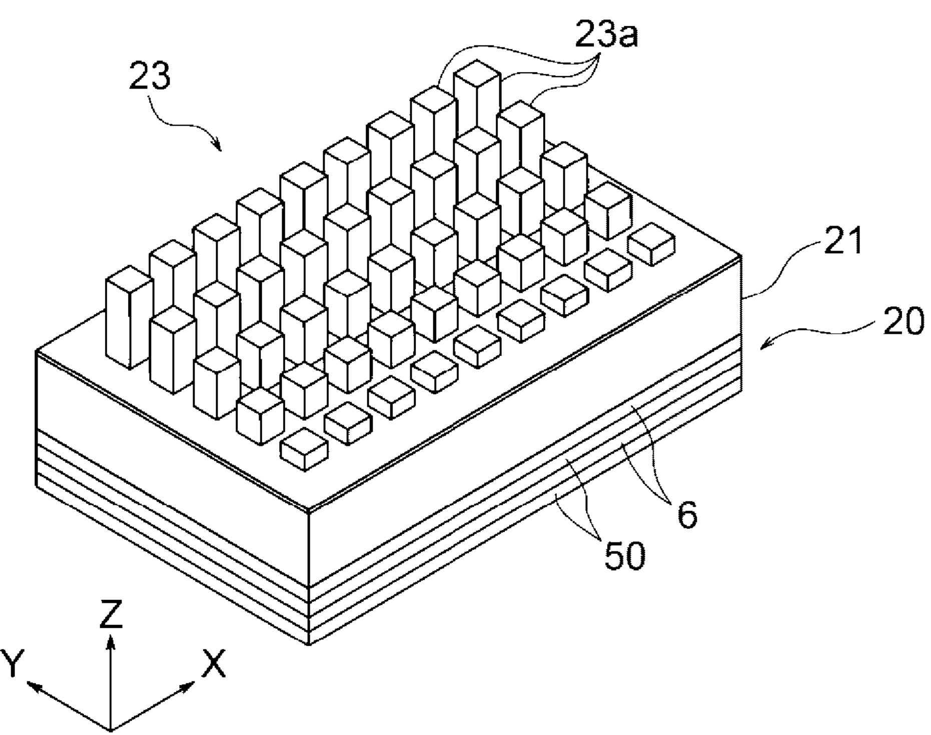
FIG. 32 is a perspective view showing a semiconductor device manufacturing method according to a third embodiment.

FIG. 32 is a perspective view showing a semiconductor device manufacturing method according to a third embodiment. In the first embodiment, an example wherein the contact holes H1 to H5 having m kinds of depth are formed in the stacked body 20, using the stepped-form resist film 23 whose heights differ in the Y direction, is described. As opposed to this, the third embodiment is such that the resist film 23 has a quantity m×n of columnar portions 23*a* having m kinds of height that differ in the Y direction. In the third embodiment, the contact holes H1 to H5 having m kinds of depth are formed in the stacked body 20 using the resist film 23 having this kind of quantity m×n of columnar portions 23*a*. Subsequently, in the same way as in the first embodiment, the contact holes are processed multiple times using the resist film 25 in such a way as to have m×n kinds of depth. In FIG. 32, m is 5 and n is 9.

In the third embodiment too, in the same way as in the first embodiment, contact holes having a multiple of depths, and contact plugs inside the contact holes, can be formed efficiently. Also, according to the third embodiment, a volume of the resist film 23 can be reduced, because of which an amount used of the resist 230 used in forming the resist film 23 can be reduced.

Fourth Embodiment

Figure 33:
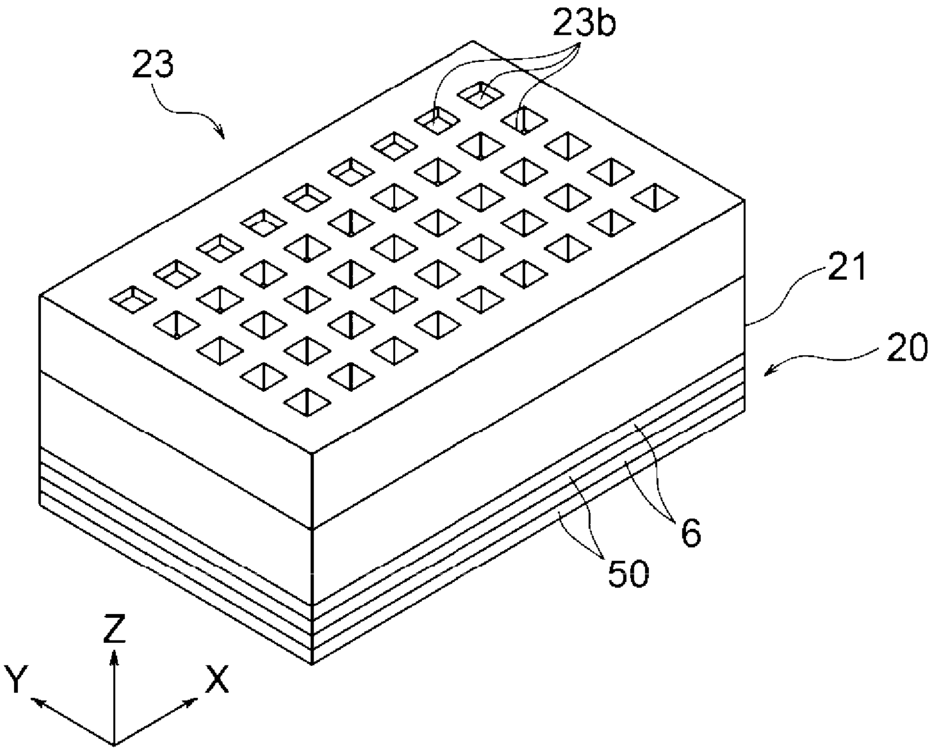
FIG. 33 is a perspective view showing a semiconductor device manufacturing method according to a fourth embodiment.

FIG. 33 is a perspective view showing a semiconductor device manufacturing method according to a fourth embodiment. In the fourth embodiment, as shown in FIG. 33, the resist film 23 has a quantity m×n of hole portions 23*b* having m kinds of depth (that is, bottom face heights) that differ in the Y direction. In the fourth embodiment, the contact holes H1 to H5 having m kinds of depth are formed in the stacked body 20 using the resist film 23 having this kind of quantity m×n of hole portions 23*b*. Subsequently, in the same way as in the first embodiment, the contact holes are processed multiple times using the resist film 25 in such a way as to have m×n kinds of depth. In FIG. 33, m is 5 and n is 9.

In the fourth embodiment too, in the same way as in the first embodiment, contact holes having a multiple of depths, and contact plugs inside the contact holes, can be formed efficiently.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device manufacturing method, comprising:

forming, on a substrate, a stacked body including a plurality of first films and a plurality of second films alternately stacked in a height direction; and forming a number (m×n) of holes through the stacked body that has a number (m×n) of depths, wherein the number (m) depths are arranged in a first direction intersecting the height direction and the number (n) depths are arranged in a second direction intersecting the height direction and the first direction, wherein the step of forming a number (m×n) of holes includes:

forming, on the stacked body, a hard mask layer including a number (m×n) of through via holes, forming, on the hard mask layer, a mask member having a number (m) of upper faces, wherein the upper faces have different heights arranged in the first direction, and wherein the mask member fills the number (m×n) of through via holes of the hard mask layer; and forming, in the stacked body, a number (m×n) of holes having the number (m) depths arranged in the first direction using by etching the mask member filling the through via holes of the hard mask layer.

2. The semiconductor device manufacturing method according to claim 1, wherein the height of each of the upper faces of the mask member along the second direction is uniform.

3. The semiconductor device manufacturing method according to claim 1, wherein the mask member has two times or more of the number (m) heights in the first direction and the second direction.

4. The semiconductor device manufacturing method according to claim 1, wherein the mask member has a stepped structure with the number (m) of the upper surfaces arranged in the first direction.

5. The semiconductor device manufacturing method according to claim 1, wherein the mask member has a number (m×n) of columnar portions with different heights in the first direction.

6. The semiconductor device manufacturing method according to claim 1, wherein the mask member has a number (m×n) of holes with different depths in the first direction.

7. The semiconductor device manufacturing method according to claim 1, wherein the mask member is formed based on a nanoimprint lithographic method.

8. The semiconductor device manufacturing method according to claim 1, wherein the step of forming a number (m×n) of holes further includes forming, on the hard mask layer, a second mask member that exposes a subset of the number (m×n) holes having the number (m) depths.

9. The semiconductor device manufacturing method according to claim 8, wherein the number (m×n) holes arranged as a plurality of rows in parallel with each other in the second direction, the step of forming a second mask member includes:

repeating step of exposing and covering of holes in units of $2^{(k-1)}$ rows (k≥1) in the second direction starting from 2(k−1)+1 rows in the second direction.

10. The semiconductor device manufacturing method according to claim 9, further comprising repeating the step of exposing holes in units of $2^{(k-1)}$ of the rows in the second direction k times, wherein k satisfies a condition, $n \geq 2^{(k-1)}$, where number (n) represents a total of the rows.

11. The semiconductor device manufacturing method according to claim 1, wherein an etching resistance of the mask member is lower than an etching resistance of the hard mask layer.

12. The semiconductor device manufacturing method according to claim 1, further comprising forming a conductive member layer in interiors of the number (m×n) holes.

13. The semiconductor device manufacturing method according to claim 1, wherein an upper face of the stacked body is uniform.

14. The semiconductor device manufacturing method according to claim 1, wherein the number (m) and the number (n) are different.

15. The semiconductor device manufacturing method according to claim 2, wherein the through via holes of the hard mask layer arranged in the second direction and one of the upper faces of the mask member along the second direction overlaps each other viewed from the height direction.

* * * * *